(12) United States Patent
Jensen et al.

(10) Patent No.: US 7,032,083 B1
(45) Date of Patent: Apr. 18, 2006

(54) GLITCH-FREE MEMORY ADDRESS DECODING CIRCUITS AND METHODS AND MEMORY SUBSYSTEMS USING THE SAME

(75) Inventors: Robert Arthur Jensen, Austin, TX (US); Mail Khoi, Austin, TX (US); Vikram Shenoy, Austin, TX (US); Dimitris Pantelakis, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 224 days.

(21) Appl. No.: 10/217,364

(22) Filed: Aug. 13, 2002

(51) Int. Cl.
*G06F 12/00* (2006.01)

(52) U.S. Cl. .................................. 711/154; 345/567

(58) Field of Classification Search ................ 711/154; 345/564–567, 559; 365/230.06, 233.5
See application file for complete search history.

(56) References Cited

U.S. PATENT DOCUMENTS 6,215,712 B1 * 4/2001 Yanagisawa ................ 365/201

* cited by examiner

*Primary Examiner*—Pierre M. Vital
(74) *Attorney, Agent, or Firm*—Thompson & Knight LLP

(57) ABSTRACT

Memory address decoder circuitry including a decoder for activating a corresponding memory access control conductor in response to registered address bits. An address register stores received address bits for presentation to the inputs of the decoder and includes reset circuitry for resetting the outputs of the address register to an inactive state during an inactive time period to reduce transition glitches in the decoder during latching in a subsequent active period.

18 Claims, 6 Drawing Sheets

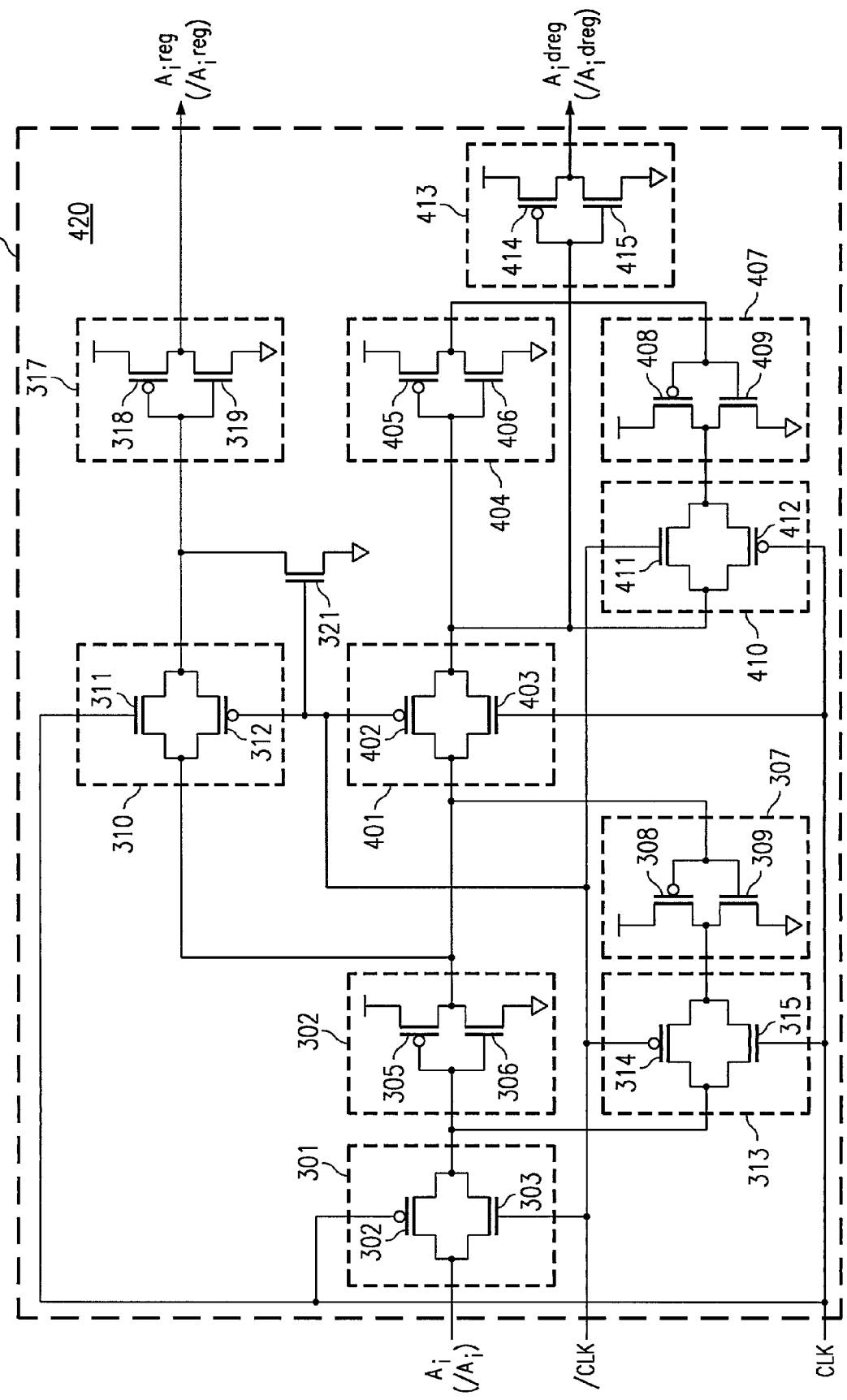

US 7,032,083 B1

GLITCH-FREE MEMORY ADDRESS DECODING CIRCUITS AND METHODS AND MEMORY SUBSYSTEMS USING THE SAME

BACKGROUND OF THE INVENTION

1. Field of the Invention

The present invention relates in general to electronic memories and in particular to glitch-free memory address decoding circuits and methods and memory subsystems using the same.

2. Background of Invention

A typical electronic memory system, such as a random access memory (RAM) system or a read-only memory (ROM) system, is based on an array of rows and columns of memory cells. Depending on the architecture, these memory cells are organized into data storage locations for storing data words of a given width. For example, in a "16 by 16" memory system, data are stored as 16-bit wide words in 16-column wide locations along a corresponding row. Data are then accessed (read and written) to a given location at the intersection of the corresponding row and columns using associated row and column addresses.

In synchronous memory systems, row and column addresses are latched into an address register and held until the next set of row and column addresses arrives. The current address in the address register is decoded into row and column select signals which control the selection of the rows and columns corresponding to the addressed location. Once these row and column signals have settled into the proper state, the decoder outputs are enabled, and the access is performed.

The process of latching and decoding each address, including allowing the decoder outputs to settle, requires a finite, although variable, time period. If the decoder outputs are enabled before this process is complete, glitches may occur which corrupt the data and/or misdirect the access to the wrong memory location. These glitches may also add noise to the system and cause excess power dissipation. Hence, a time delay is typically introduced between address latching and decoder output enablement to allow for circuit activation and signal settling. This delay normally includes sufficient margin to account for fabrication process, voltage and temperature variation, noise, and similar factors that impact circuit timing.

Designing timing circuitry to provide the sufficient timing margins required to ensure glitch-free memory operation across a range of fabrication and operating variables is a relatively complicated effort. For example, the timing margins should be minimized since holding-off the enablement of the decoder outputs directly increases the time to access the array. In high-speed memory systems, minimized access time is a critical design parameter. On the other hand, decoder output enablement must be delayed by a sufficient amount of time to avoid the problem of glitches described above. Hence, new circuits and methods are required which relax the design constraints on the access timing circuitry while still allowing high-speed glitch-free accesses.

SUMMARY OF INVENTION

The principles of the present invention provide for the resetting of the outputs of an address latch or register following memory address decoding to avoid glitches during a subsequent address cycle. According to one particular embodiment, memory address decoder circuitry, which includes a decoder for activating a corresponding memory access control conductor in response to registered address bits, is disclosed. An address register stores received address bits for presentation to the inputs of the decoder and includes reset circuitry for resetting the outputs of the address register to an inactive state during an inactive time period to reduce transition glitches in the decoder during latching in a subsequent active period.

Circuits, systems, and methods embodying the inventive principles afford significant advantages over the prior art when applied to electronic memories. For example, resettable latches (registers) not only reduce or eliminate glitches during address decoding but also allow the complexity of the associated timing circuits to be substantially reduced. In particular, since the register (latch) outputs are reset to an inactive state, no location select signals are generated, even if the decoder output enable signals transition to an active state. The select signal is not generated and passed to the access control logic to enable the row and column selection until all of the registered address bits reach their final state. Furthermore, the inventive principles are embodied in a range of volatile and non-volatile electronic memory devices, including RAM devices, ROM devices, and Flash memory devices.

BRIEF DESCRIPTION OF DRAWINGS

For a more complete understanding of the present invention, and the advantages thereof, reference is now made to the following descriptions taken in conjunction with the accompanying drawings, in which:

FIG. 4B is an electrical schematic diagram of an exemplary resettable latch which resets to a logic high inactive state and includes a second output latch for holding data for an additional clock cycle, the latch of FIG. 4B is suitable for use in constructing a fourth embodiment of the latch of FIG. 2.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
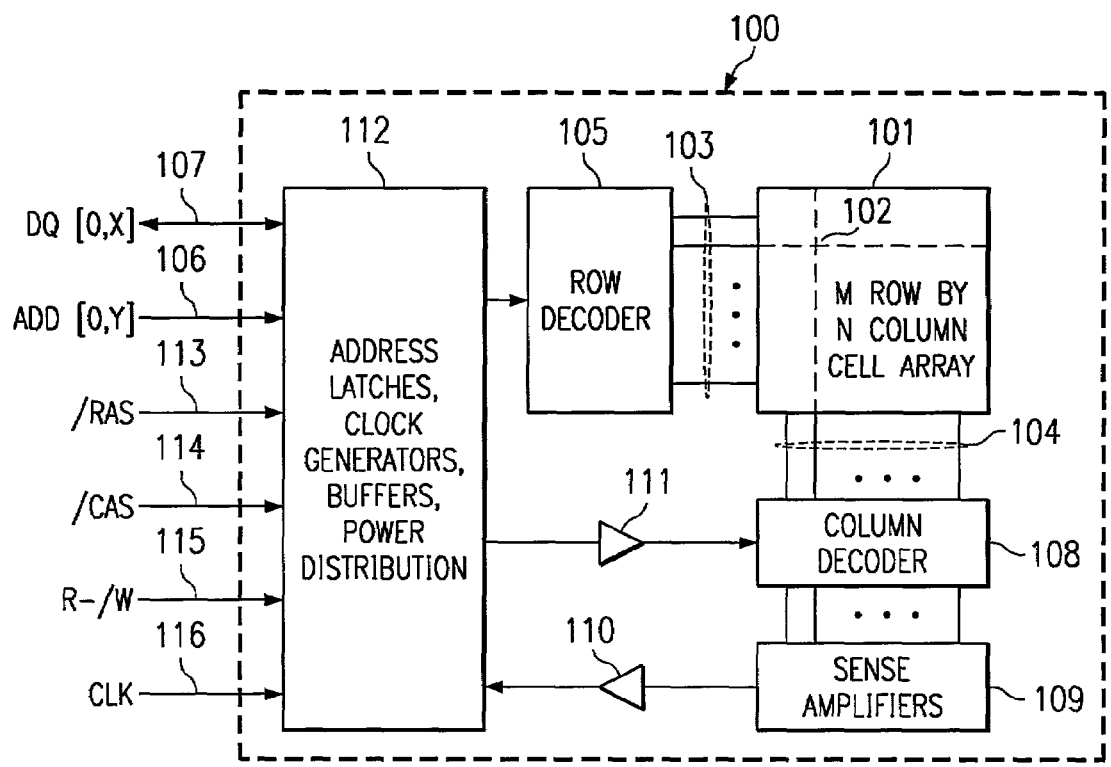
FIG. 1 is a high level functional block diagram of an exemplary memory subsystem suitable for describing the present inventive principles.

FIG. 1 is a high-level functional block diagram of an exemplary memory subsystem 100 suitable for describing the application of the present inventive principles. Memory subsystem 100 may be, for example, a stand-alone integrated circuit or an embedded memory subsystem within a system-on-a-chip.

Memory system 100 is based on an array 101 of memory cells 102 organized in M number of rows and N number of columns. Memory cells 102 are, for example, volatile memory cells, such as dynamic random access memory (DRAM) and static random access memory (SRAM) cells, or non-volatile memory cells, such as mask programmed read-only memory (ROM) and Flash (electrically-erasable and programmable) ROM cells. Array 101 may be divided into subarrays as known in the art.

Each memory cell 102 is accessed through a conductive wordline 0, 1, or 2 associated with the corresponding row and a conductive bitline 104 associated with the intersecting column. A row in array 101 is selected using a row decoder 105 which activates the corresponding wordline 0, 1, or 2 in response to row address received at the Y-bit wide subsystem multiplexed address port 106 (ADD[0:Y-1]) (FIG. 1 shows ADD[0:Y]. Therefore, either drawing or spec. needs to be corrected.). A location along the selected row is accessed through X-bit wide data port 107 (DQ[0:X-1]) (FIG. 1 shows DQ [0:X]. Therefore, either drawing or spec. needs to be corrected.) and the corresponding bitlines 104 through a column decoder 108 and sense amplifiers 109 in response to a column address received through address port 106. In other words, exemplary memory subsystem 100 has a "by-X" configuration in which each location is X number of cells (columns) wide and accessed through an X-bit wide data port 107, in which X is an integer greater than one (1). The address port width Y is a function of the number of rows and columns in array 101 and the width of each addressable location.

In the illustrated embodiment, row and column addresses are multiplexed through address port 106 using conventional row and column address strobes (/RAS and /CAS) presented at /RAS input 113 and /CAS input 114. For each row address, multiple column addresses may be generated and clocked-in with /CAS in the page mode to access multiple locations along the selected row during the same /RAS cycle. Read and write operations are controlled by the read—write signal R-/W presented at R-/W input 115. In synchronous embodiments, the timing base is derived from the master clock CLK presented at clock port 116.

A read operation to an addressed location in array 101 is generally implemented by sensing and latching the data from the row of cells along the active wordline 0, 1, or 2 through the column decoder 108 and into sense amplifiers 109. Data from the X-bit location or page of X-bit wide locations being read are then passed by sense amplifier 109 and a read buffer/amplifier 110 to data port 107. During a write operation, data at data port 107 are driven to the location or locations selected by column decoder 108 by a write amplifier 111 through the corresponding bitlines 104.

Address latches, clock generators, buffers, power distribution circuitry are generally represented by block 112 in FIG. 1. Address latches suitable for use in memory system 100 embodying the inventive principles are further discussed below.

Figure 2:
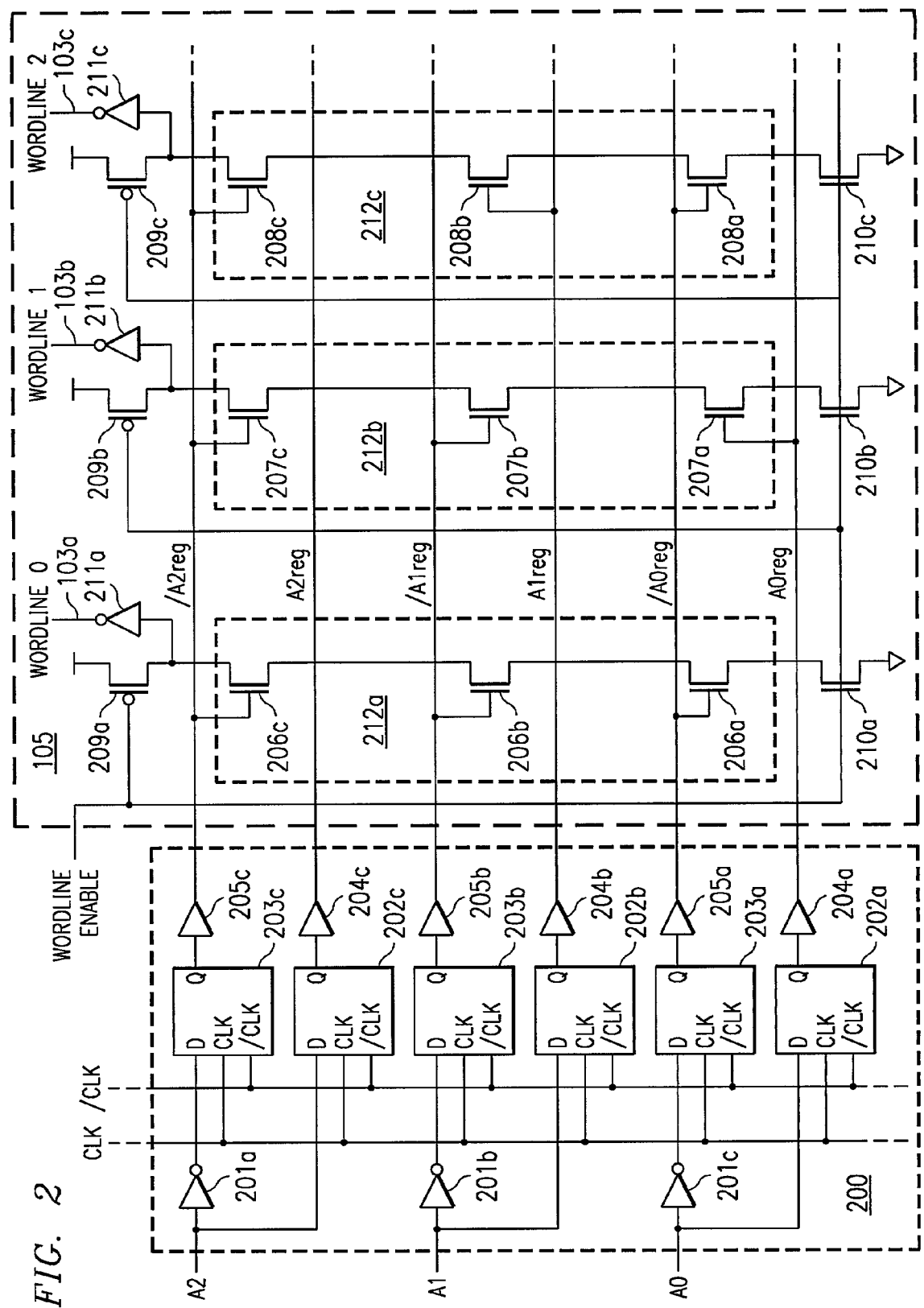
FIG. 2 is an electrical schematic diagram of portions of an exemplary address latch (register) and an exemplary associated row decoder embodying the principles of the present invention.

FIG. 2 is a more detailed functional block diagram of a portion of a row address latch (register) 200 corresponding to address bits $A_0$, $A_1$, and $A_2$ of a Y-bit wide row address received through address port 106. Additionally, the complement $/A_i$ of each address bit $A_i$, in which i is an integer index between 0 and Y−1, is generated by a corresponding input inverter 201. Each address bit $A_i$ is latched by a self-resetting latch 202 and each complementary address bit $/A_i$ by a self-resetting latch 203, in response to a timing signal CLK and its complement /CLK which are derived from the system clock. For illustrative purposes, three latches 202a–202c corresponding to address bits $A_0$–$A_2$ and three latches 203a–203c corresponding to complementary address bits $/A_0$ –$/A_2$ are shown in FIG. 2. Embodiments of self-resetting latches 203 and 204 embodying the inventive principles are discussed in detail below. The complementary registered address bits latched in self-resetting latches 202 and 203 ($A_i$reg and $/A_i$reg) are respectively driven by output buffers/drivers 204 and 205 to the inputs of row decoder 105.

The complementary address bit pairs $A_i$, $/A_i$ held in the corresponding latches 202 and 203 drive row decoders 212 within row decoder block 105 (see also, FIG. 1). Portions of three row decoders 212a–212c controlling wordlines 0–2 are shown in FIG. 2 for discussion purposes. Generally, each decoder 212 includes one decoder transistor for each complementary address bit pair Ai, /Ai and each wordline 0, 1, or 2. The current paths of the decoder transistors of a given decoder 212 are coupled in series between the corresponding wordlines 0, 1, or 2 and ground, and the gates are coupled to either the corresponding latch 202 (registered bit $A_i$reg) or latch 203 (registered bit $/A_i$reg), depending on the decode logic. For example, representative transistors 206a–206c of row decoder 212a control in part Wordline 0 in response to representative address bits $A_0$reg, $A_1$reg, and $A_2$reg. Similarly, address bits $/A_0$reg, $A_1$reg, and $A_2$reg control in part Wordline 1 through representative transistors 207a–207c of row decoder 212b and address bits $A_0$reg, $/A_1$reg, and $A_2$reg control in part Wordline 2 through transistors 208a–208c of row decoder 212c. In the illustrative embodiment of FIG. 2, NMOS decoder transistors 206–208 are shown which turn-on in response to active high states of $A_i$reg and/$A_i$reg. In the alternate embodiments of the inventive principles, an active low decoder logic may be used.

Each wordline 0, 1, or 2 is enabled/disabled by a PMOS transistor 209 and an NMOS transistor 210 in response to the WORDLINE ENABLE control signal and driven by an associated inverting driver 211. Representative PMOS transistors 209a–209c, NMOS transistors 210a–210c, and inverters 211a–211c associated with Wordlines 0–3 are shown for the partial decoder array 105 of FIG. 2.

Row decoders 212a–212c uniquely decode complementary address bit pairs $A_i$, $/A_i$ to activate the selected wordlines 0 to 3 (Delete 103a to 103c from FIG. 2 to avoid double-numbering of the wordlines.) being accessed. During the inactive period, WORDLINE ENABLE control signal is held in a logic low level such that PMOS transistors 209a–209c and inverters 211a–211c hold wordlines 0 to 3 of array 101 in an inactive low state. The complementary address bit pairs $A_i$, $/A_i$ are then latched into latches 202a–202c and 203a–203c, and the resulting registered address bits $A_i$reg, $/A_i$reg are presented to the gates of transistors 206a–206c, 207a–207c, and 209a –209c are allowed to settle to their final levels. Registered address bits $A_i$reg, $/A_i$reg selectively turn-on the decoder transistors of decoders 212a–212c, in the case of decoders 212a–212c, transistors 206a–206c, 207a–207c and 209a–209c, corresponding to the wordlines 0 to 3 to be selected. Decoders 212a–212c for the deselected wordlines remain turned-off. The WORDLINE ENABLE control signal transitions to an active high state turning on NMOS transistors 210a–210c. With the active decoders 212a–212c of the selected wordlines 0 to 3 turned on and conducting, the input to the associated inverter 211a–211c is pulled down to ground. In turn, the selected wordline is driven to an active high state for the access.

In conventional decoding schemes, when the address bits within latches 202a–202c and 203a–203c transition, one or more row decoders 212a–212c may turn-on or turn-off randomly until the registered address bits $A_r$reg, $/A_r$reg settle. Therefore, normally, in order to ensure that the correct wordlines 0 to 3 is selected, the activation of the WORDLINE ENABLE control signal must be held-off long enough to allow decoders 212a–212c to settle to their proper states. On the other hand, to minimize access times to cell array 101, the hold-off time designed into WORDLINE ENABLE control signal must be minimized. In a conventional system, a number of variables must be considered in determining the margins on WORDLINE ENABLE control signal.

The time between receipt of the address word and the decoding of each complementary address bit pair $A_i$, $/A_i$ by decoders 212a–212c varies between address bit paths due to both chip-wide effects (e.g. process, temperature, and supply voltage) and local effects (e.g. the fabrication and layout of transistors). In other words, the delay between the latching of the address, the settling of registered address bits $A_r$reg, $/A_r$reg, and consequently the proper activation and deactivation of the correct decoder transistors 206a–206c, 207a–207c, and 208a–208c, will vary between address bits. In sum, the delay in the activation of WORDLINE ENABLE control signal must include sufficient margin to cover the worst case expected delay to decode all of the bits Ai, /Ai of the entire address word. This delay margin must also be sufficient to account for variations in WORDLINE ENABLE control signal itself with the same chip-wide and local effects.

According to the principles of the present invention, self-resetting latches 202a–202c and 203a–203c reset to an inactive state after each access such that decoders 212a–212c are disabled, no matter what the current state of WORDLINE ENABLE control signal. When the new address word and its complement are latched into latches 202a–202c and 203a–203c, only those control signals required to turn-on transistors (e.g. transistors 206a–206c, 207a–207c, and 208a–208c) within decoders 212a–212c are active. The remaining control signals $A_r$reg, $/A_r$reg are maintained in an inactive state and thus cannot cause indeterminate activation of the transistors of decoders 212a–212c. Glitches are thereby prevented, even if WORDLINE ENABLE control signal transitions to an active state before signals $A_r$reg, $/A_r$reg settle. As a result, the timing margins on WORDLINE ENABLE control signal are relaxed, which result in a simplified circuit design and improved access times.

Figure 3A:
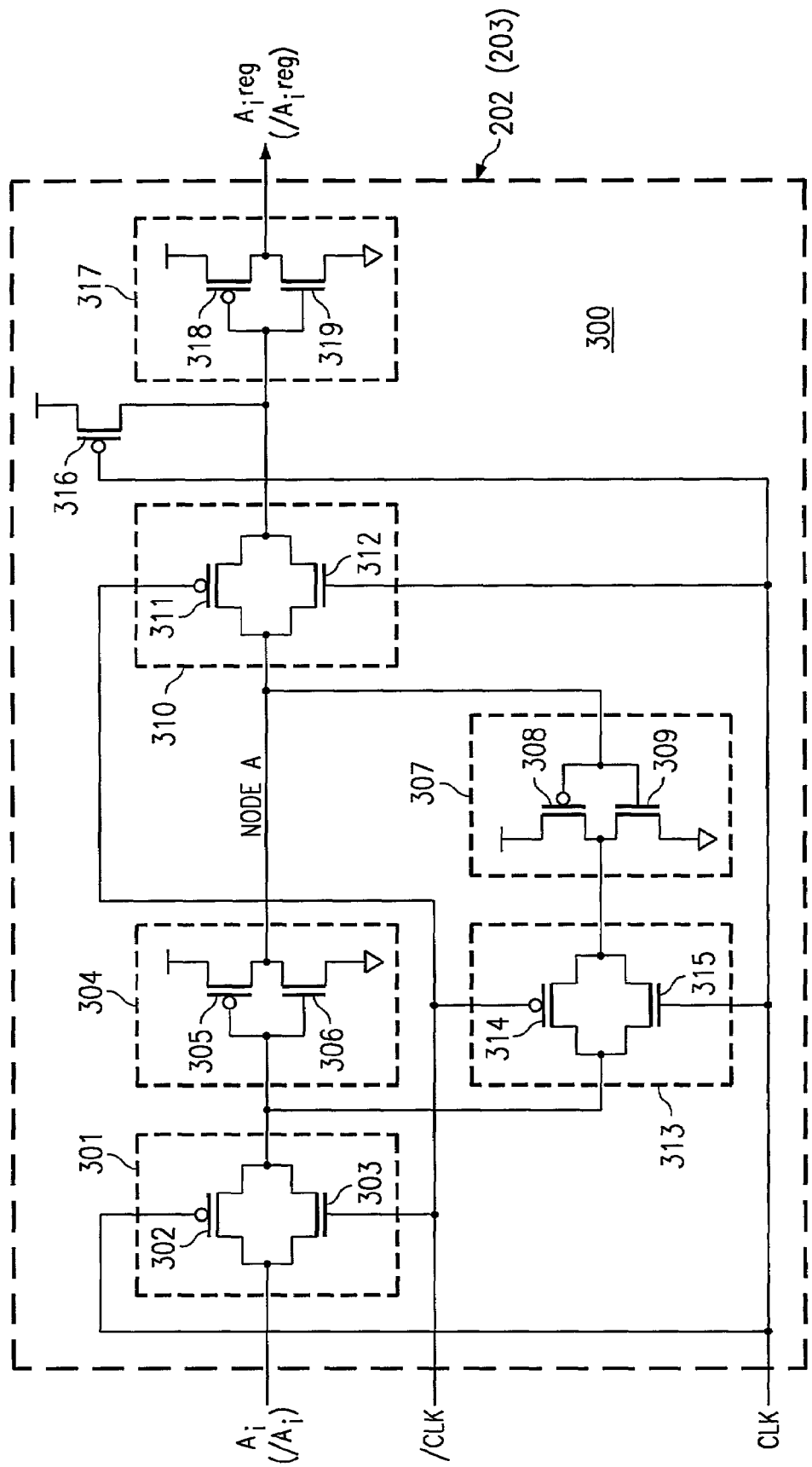
FIG. 3A is an electrical schematic diagram of an exemplary resettable latch which resets to a logic low inactive state and is suitable for use in constructing in one embodiment of the address latch shown in FIG. 2.

FIG. 3A is an electrical schematic diagram of a first self-resetting latch 300 suitable for use in applications such as latches 202a–202c and 203a–203c of FIG. 2 requiring an active high output. At the start of the address cycle, the clock CLK is in a low state and its complement /CLK is in a logic high state. The corresponding address bit $A_i$ or $/A_i$ ($A_i$ in the case of latches 202a–202c and $/A_i$ in the case of latches 203a–203c) is passed through the transfer gate 301 formed by PMOS transistor 302 and NMOS transistor 303 and then inverted by an inverter 304 formed by PMOS transistor 305 and NMOS transistor 306. The output of inverter 304 (Node A) drives the input of a second inverter 307 formed by PMOS transistor 308 and NMOS transistor 309. At the same time, transfer gate 310 (PMOS transistor 311 and NMOS transistor 312) and transfer gate 313 (PMOS transistor 314 and NMOS transistor 315) are turned-off.

During the period when CLK is low, PMOS reset transistor 316 holds the input to output inverter 317 (PMOS transistor 318 and NMOS transistor 319) high. Consequently, the latch 300 output ($A_r$reg in the case of latches 202a–202c or $/A_r$reg in the case of latches 203a–203c) is held in a reset (inactive) low state. On the transitions of CLK to a logic high and /CLK to a logic low, transfer gate 301 turns-off and transfer gates 310 and 313 turn-on. Inverters 304 and 307 latch the bit at Node A. Reset transistor 316 releases the input to output inverter 317 which in turn drives the output $A_r$reg ($/A_r$reg) of latch 300 from Node A. At the end of the address cycle, CLK transitions back to a logic low state, and the latch 300 output $A_r$reg or $/A_r$reg resets to the inactive (logic low) state by reset transistor 316.

Figure 3B:
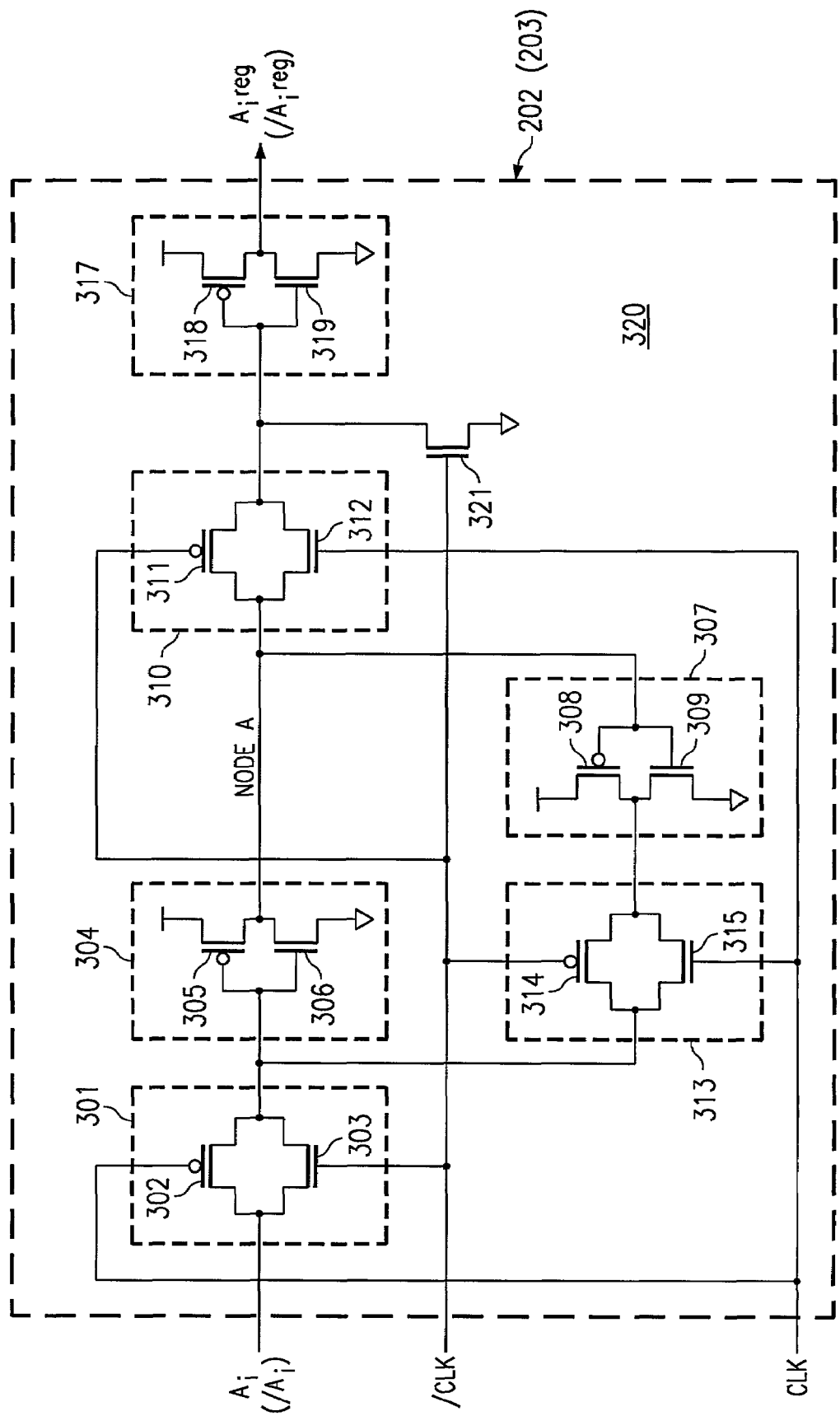
FIG. 3B is an electrical schematic diagram of an exemplary resettable latch which resets to a logic high inactive state and is suitable for use in constructing in a second embodiment of the decoder of FIG. 2.

FIG. 3B illustrates a second self-resetting latch 320 suitable for use in such applications requiring an active low output. The structure and operation of latch 320 is similar to that of latch 300. However, in this case, an NMOS transistor 321 pulls down the input to output inverter 317 to ground when /CLK transitions to a logic high state. With /CLK high, the output $A_r$reg or $/A_r$reg, of latch 320 is reset to an inactive high state.

Figure 4A:
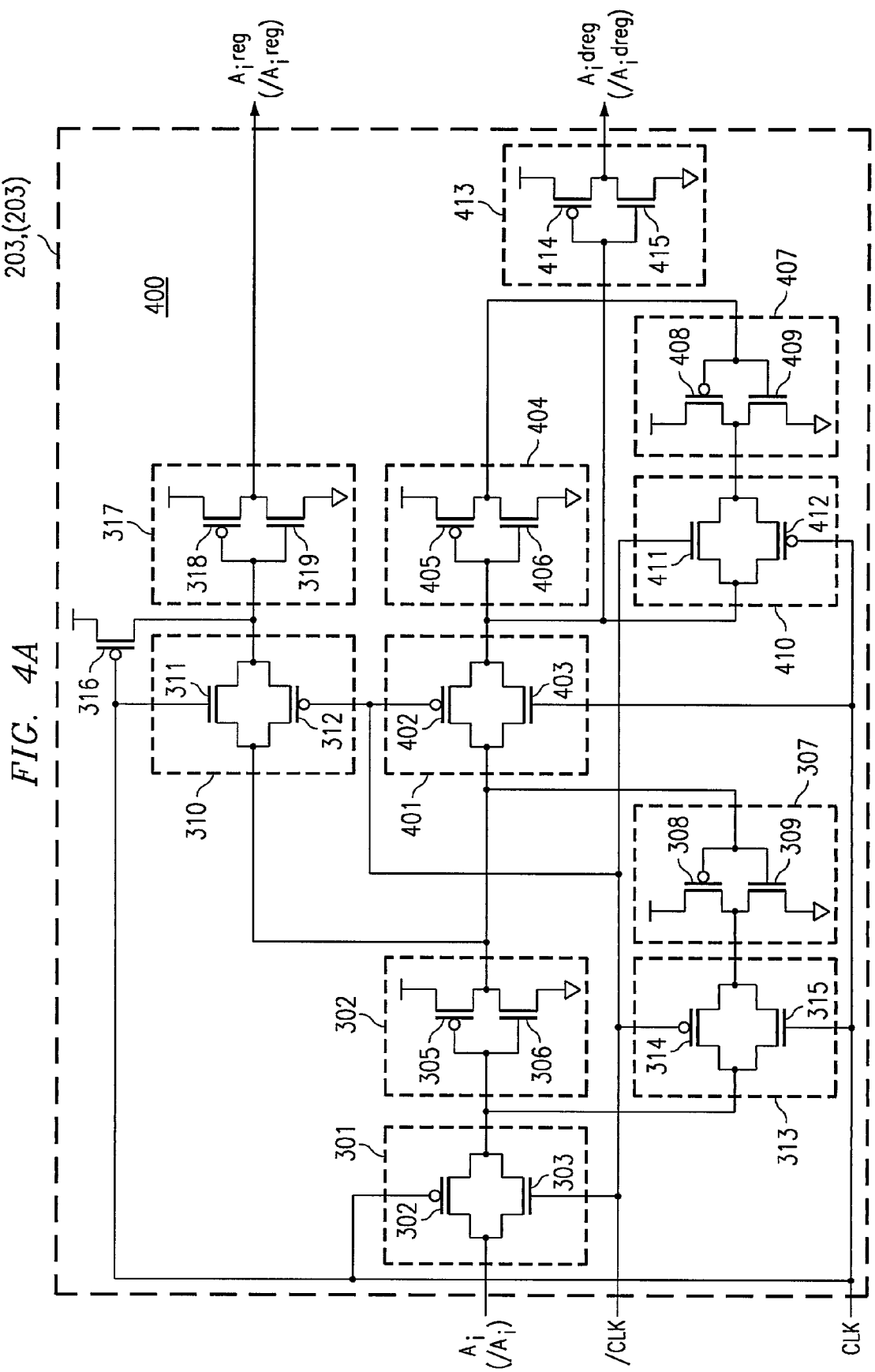
FIG. 4A is an electrical schematic diagram of an exemplary resettable latch which resets to a logic low inactive state and includes a second output latch for holding data for an additional clock cycle, the latch of FIG. 4A is suitable for use in constructing a third embodiment of the latch of FIG. 2.

Address latch 400 shown in FIG. 4A adds an additional register function to latch 300 of FIG. 3A which holds the latched address bit at a double-registered output $A_i$dreg or $/A_i$dreg until the next active cycle of clock CLK. This embodiment also generates the resettable single-registered output $A_r$reg ($/A_r$reg) discussed above. The operation described above with respect to latch 300 applies to that of latch 400 with the following additions.

Transfer gate 401 (PMOS transistor 402 and NMOS transistor 403) passes the bit at Node A to Node B (Nodes A and B are not labeled in FIG. 4A or 4B) when CLK transitions to a logic high and /CLK transitions to a logic low. Inverter 404 (PMOS transistor 405 and NMOS transistor 406) which drives the input of a second inverter 407 (PMOS transistor 408 and NMOS transistor 409) inverts the bit at Node B. Inverters 404 and 407 form a latch. On the next transition of CLK low and /CLK high, transfer gate 410, formed by PMOS transistor 411 and NMOS transistor 412, turn-on to latch the bit at Node B. Transfer gate 401 at the same time turns-off. The registered output $A_i$dreg is driven from Node B by an inverter 413 formed by PMOS transistor 414 and NMOS transistor 415. The bit at registered output $A_i$dreg is held until the next transition of CLK and /CLK low at which time the next bit passed to Node A is clocked to Node B and latched.

A similar embodiment 420 is shown in FIG. 4B in which the additional register function described in conjunction with FIG. 4A is added to the output of the latch 320 of FIG. 3B. In this case, the complementary couple-registered bit/ $A_i$dreg is held until the next active cycle of clock CLK.

Figure 5:
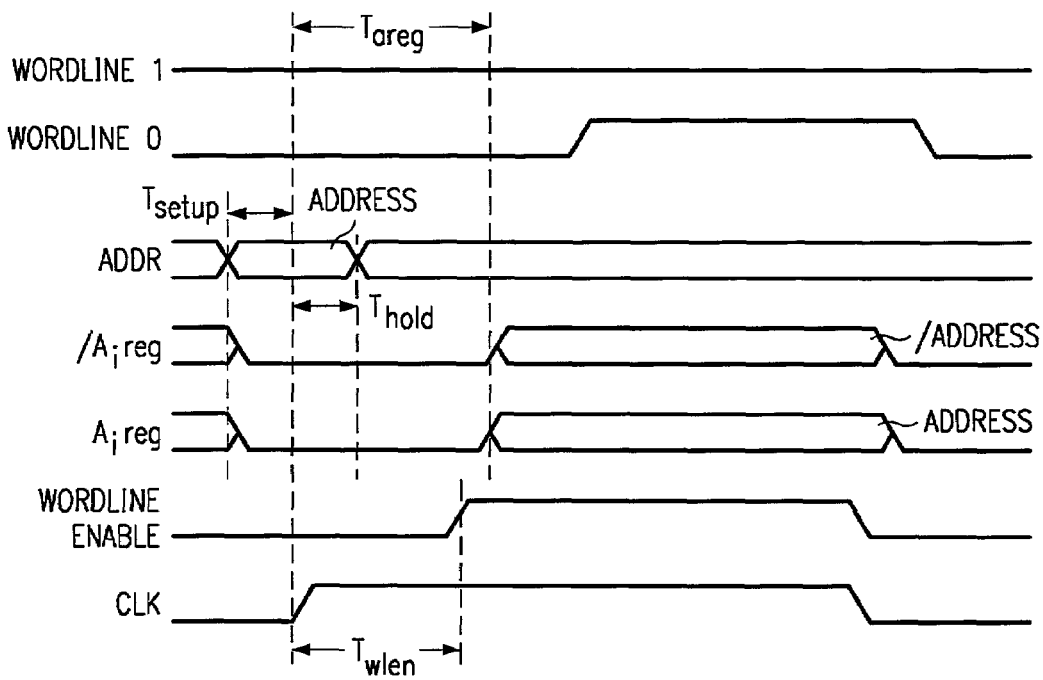
FIG. 5 is a timing diagram illustrating the typical operation of the address latching and decoding circuitry of FIG. 2 according to the inventive principles.

FIG. 5 is a timing diagram illustrating the advantages of using self-resetting latches according to the inventive principles. In particular, immediately following the transition of CLK to an active high state, the registered complementary address bits $A_r$reg and $/A_r$reg are in their inactive states. As a result, no wordline 0, 1, or 2 is decoded, even if WORDLINE ENABLE control signal transitions to an active high state before $A_r$reg and $/A_r$reg have settled. A wordline 0, 1, or 2 is selected only after all $A_r$reg and $/A_r$reg bits reach their final states. The constraints on circuitry generating WORDLINE ENABLE control signal is therefore relaxed leading to a simplified design.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A memory address decoder circuitry comprising:
   a decoder for activating a corresponding memory access control conductor in response to registered address bits;
   an address register for registering received address bits for presentation to inputs of said decoder and having a reset circuitry for resetting outputs of said address register to an inactive state during an inactive time period to reduce transition glitches in the decoder during latching in an active period; and
   output circuitry for driving said memory access control conductor and activated during said active period in response to an enable signal and valid decoder response, wherein said enable signal enables said output circuitry of said decoder prior to setting of registered address bits at said inputs of said decoder.

2. The memory address decoder circuitry of claim 1 wherein said decoder is operable to activate a corresponding wordline conductor.

3. The memory address decoder circuitry of claim 1 wherein said reset circuitry resets said outputs of said address register to an inactive low state.

4. The memory address decoder circuitry of claim 1 wherein said reset circuitry resets said outputs of said address register to an inactive high state.

5. The memory address decoder circuitry of claim 1 wherein the address register stores said address bits and complements of said address bits.

6. The memory address decoder circuitry of claim 1 wherein said register is further operable to reset said address bits during a second inactive time period following said active time period.

7. A memory address decoder circuitry comprising:
   a decoder for activating a corresponding memory access control conductor in response to registered address bits;
   an address register for registering received address bits for presentation to inputs of said decoder and having a reset circuitry for resetting outputs of said address register to an inactive state during an inactive time period to reduce transition glitches in the decoder during latching in an active period; and
   output circuitry for driving said memory access control conductor and activated during said active period in response to an enable signal and valid decoder response, wherein said enable signal enables said output circuitry of said decoder prior to arrival of registered address bits at said inputs of said decoder.

8. The memory address decoder circuitry of claim 7 wherein said decoder is operable to activate a corresponding wordline conductor.

9. The memory address decoder circuitry of claim 7 wherein said reset circuitry resets said outputs of said address register to an inactive low state.

10. The memory address decoder circuitry of claim 7 wherein said reset circuitry resets said outputs of said address register to an inactive high state.

11. The memory address decoder circuitry of claim 7 wherein the address register stores said address bits and complements of said address bits.

12. The memory address decoder circuitry of claim 7 wherein said register is further operable to reset said address bits during a second inactive time period following said active time period.

13. A method of decoding a memory address with decoding circuitry including an address register comprising a set of latches for storing address bits of the address and a decoder for generating select control signals in response to the address bits stored in the latches, comprising:
   during an inactive period
      resetting an output of each of the plurality of latches of the address register to an inactive state to reduce transition glitches in the decoder during latching; and
      presenting the address bits to inputs of the set of latches; and during an active period
      latching the address bits in the latches of the address register;
      selectively driving inputs of the decoder with the latched address bits to generate the second control signals; and
      enabling an output of the decoder prior to setting of an active latched address bit signal at an input of the decoder.

14. The method of claim 13 further comprising resetting the latch output signals during a second inactive period following the active period.

15. The method of claim 13 wherein the select control generated by the decoder comprise wordline select signals.

16. The method of claim 13 wherein the active latch output signal is a logic high signal and the inactive latch output signal is a logic low signal.

17. The method of claim 13 wherein the active latch output signal is a logic low signal and the inactive latch output signal is a logic high signal.

18. A memory system comprising;
   an array of storage locations accessed in response to an associated active select signal; and
   an address decoder circuitry operating in response to a clock for generating an active select signal accessing an addressed one of various storage locations comprising:
      resettable address latches for latching address bits to latch outputs during active periods of time and resetting the latch outputs to an inactive state during inactive periods of time;
      a decoder for generating the active select signal in response to address bits latched in the resettable address latches; and
      output circuitry for driving the active select signal during said active periods in response to a valid decoder response, said output circuitry enabled by an enable signal prior to setting of latched address bits at inputs of said decoder.

* * * * *

UNITED STATES PATENT AND TRADEMARK OFFICE
CERTIFICATE OF CORRECTION

PATENT NO. : 7,032,083 B1  Page 1 of 1
APPLICATION NO. : 10/217364
DATED : April 18, 2006
INVENTOR(S) : Jensen et al.

It is certified that error appears in the above-identified patent and that said Letters Patent is hereby corrected as shown below:

On the title page item (75),
"Mail Khoi" should read --Khoi Mai--

Signed and Sealed this

Fifteenth Day of August, 2006

JON W. DUDAS
*Director of the United States Patent and Trademark Office*